(12) United States Patent
Lee

(10) Patent No.: US 11,678,449 B2
(45) Date of Patent: Jun. 13, 2023

(54) DISPLAY APPARATUS

(71) Applicant: Samsung Display Co., Ltd., Yongin-si (KR)

(72) Inventor: Jungil Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/454,003

(22) Filed: Nov. 8, 2021

(65) Prior Publication Data

US 2022/0217858 A1 Jul. 7, 2022

(30) Foreign Application Priority Data

Jan. 5, 2021 (KR) .................. 10-2021-0000697

(51) Int. Cl.
*H05K 5/00* (2006.01)
*H05K 5/02* (2006.01)

(52) U.S. Cl.
CPC ......... *H05K 5/0226* (2013.01); *H05K 5/0017* (2013.01)

(58) Field of Classification Search
None
See application file for complete search history.

(56) References Cited

U.S. PATENT DOCUMENTS

| 9,021,657 | B2* | 5/2015 | Park | H05K 5/0226 16/354 |
|---|---|---|---|---|
| 9,173,288 | B1* | 10/2015 | Kim | G06F 1/1681 |
| 9,348,450 | B1* | 5/2016 | Kim | G06F 1/1616 |
| 9,535,452 | B2* | 1/2017 | Ahn | G06F 1/1615 |
| 9,572,272 | B2* | 2/2017 | Lee | H05K 5/0017 |
| 9,733,668 | B2* | 8/2017 | Park | H04B 1/385 |
| 9,801,290 | B2* | 10/2017 | Ahn | H05K 5/0017 |
| 10,063,677 | B2* | 8/2018 | Cavallaro | G06F 1/1652 |
| 10,082,827 | B2* | 9/2018 | Yamauchi | G06F 1/1652 |

(Continued)

FOREIGN PATENT DOCUMENTS

| KR | 10-2017-0057500 A | 5/2017 |
|---|---|---|
| KR | 10-2018-0040481 A | 4/2018 |

(Continued)

*Primary Examiner* — Anthony Q Edwards
*Assistant Examiner* — Rashen E Morrison
(74) *Attorney, Agent, or Firm* — Lewis Roca Rothgerber Christie LLP

(57) ABSTRACT

A display apparatus includes: a display panel including: a folding area foldable around a virtual folding axis extending in a first direction; and non-folding areas spaced from each other with the folding area therebetween; and a protection member including: a hinge member below the display panel, and overlapping with the folding area to be foldable around the folding axis; a base member overlapping with the non-folding areas; and a support member connected to the hinge member and the base member. The hinge member includes: extension parts extending in the first direction and located along a second direction crossing the first direction, each of the extension parts having a guide groove; joint parts connected to opposite ends of the extension parts, and rotatably connected to one another; and a guide part including a protruding part protruding in the first direction to be connected to the guide grooves of the extension parts.

20 Claims, 15 Drawing Sheets

(56) References Cited

U.S. PATENT DOCUMENTS

| | | | |
|---|---|---|---|
| 10,117,346 B2* | 10/2018 | Yang | G06F 1/1652 |
| 10,143,098 B1* | 11/2018 | Lee | E05D 11/06 |
| 10,274,997 B2* | 4/2019 | Lin | G06F 1/1616 |
| 10,306,788 B2* | 5/2019 | Bi | G06F 1/1681 |
| 10,416,710 B2* | 9/2019 | Mizoguchi | G06F 1/1641 |
| 10,481,634 B2* | 11/2019 | Mizoguchi | G06F 1/1616 |
| 10,564,682 B1* | 2/2020 | Wu | H05K 5/0226 |
| 10,645,205 B2 | 5/2020 | Lee | |
| 10,694,623 B2 | 6/2020 | Park | |
| 10,705,563 B2* | 7/2020 | Lin | G06F 1/1616 |
| 10,716,228 B2* | 7/2020 | You | G06F 1/1683 |
| 10,855,824 B2 | 12/2020 | Park et al. | |
| 10,948,947 B2 | 3/2021 | Yoon et al. | |
| 11,023,009 B2* | 6/2021 | Kim | G06F 1/1641 |
| 2011/0043976 A1* | 2/2011 | Visser | G09F 9/301 |
| | | | 361/679.01 |
| 2011/0063783 A1* | 3/2011 | Shim | G06F 1/1615 |
| | | | 361/679.01 |
| 2012/0120618 A1* | 5/2012 | Bohn | G06F 1/1618 |
| | | | 361/679.01 |
| 2013/0021762 A1* | 1/2013 | van Dijk | G06F 1/1681 |
| | | | 361/749 |
| 2015/0089974 A1* | 4/2015 | Seo | A44C 5/0076 |
| | | | 63/1.13 |
| 2017/0060188 A1* | 3/2017 | Han | G06F 1/1641 |
| 2018/0275725 A1* | 9/2018 | Lin | G06F 1/1616 |
| 2021/0124393 A1 | 4/2021 | Lee | |
| 2021/0165458 A1 | 6/2021 | Lee | |

FOREIGN PATENT DOCUMENTS

| | | |
|---|---|---|
| KR | 10-2018-0076271 A | 7/2018 |
| KR | 10-2019-0094264 A | 8/2019 |
| KR | 10-2020-0051104 A | 5/2020 |
| KR | 10-2021-0049238 A | 5/2021 |
| KR | 10-2021-0069182 A | 6/2021 |

* cited by examiner

DISPLAY APPARATUS

CROSS-REFERENCE TO RELATED APPLICATION

This application claims priority to and the benefit of Korean Patent Application No. 10-2021-0000697, filed on Jan. 5, 2021, the entire content of which is incorporated by reference herein.

BACKGROUND

Aspects of one or more embodiments of the present disclosure relate to a display apparatus, and more particularly, to a foldable display apparatus.

In recent years, various kinds of display apparatuses have been developed with technical developments of the display apparatuses. For example, flexible display apparatuses that may be transformed into curved, folded, or rolled shapes are being developed. The flexible display apparatuses that may be transformed into various suitable shapes may be easy to carry, and may improve convenience of the users.

The above information disclosed in this Background section is for enhancement of understanding of the background of the present disclosure, and therefore, it may contain information that does not constitute prior art.

SUMMARY

One or more embodiments of the present disclosure are directed to a display apparatus including a protection member having improved out-folding properties.

According to one or more embodiments of the present disclosure, a display apparatus includes: a display panel including: a folding area foldable around a virtual folding axis extending in a first direction; and non-folding areas spaced from each other with the folding area interposed therebetween; and a protection member including: a hinge member located below the display panel, the hinge member overlapping with the folding area, and configured to be folded around the virtual folding axis; a base member overlapping with the non-folding areas; and a support member connected to the hinge member and the base member. The hinge member includes: extension parts extending in the first direction and located along a second direction crossing the first direction, each of the extension parts having a guide groove defined in at least a portion thereof; joint parts connected to opposite ends of each of the extension parts, and rotatably connected to one another; and a guide part including a protruding part protruding in the first direction, and configured to be connected to the guide grooves of the extension parts.

In an embodiment, the protruding part may be configured to be accommodated in the guide grooves when the display panel is unfolded, and the protruding part may be configured to be spaced from at least one of the guide grooves when the display panel is folded.

In an embodiment, each of the extension parts may include an upper portion adjacent to the display panel, and a lower portion opposite to the upper portion; and the guide groove of each of the extension parts may be defined as an inner surface that is exposed by removing a portion of a corresponding extension part from among the extension parts in a direction toward the upper portion of the corresponding extension part from the lower portion thereof.

In an embodiment, a shape of the protruding part may include one from among a polygon shape and an oval shape, and the guide grooves may have a shape corresponding to the shape of the protruding part.

In an embodiment, the support member may include: a fixing part partially surrounded by the guide part; an insertion part connected to the fixing part, and extending in the second direction; a body part connected to the base member, and having an insertion groove configured to accommodate the insertion part; and a restoration part surrounding an exposed portion of the insertion part that is exposed from the body part, the restoration part having elasticity. The restoration part may be configured to be in a relaxed state when the display panel is unfolded, and the restoration part may be configured to be in a contracted state when the display panel is folded.

In an embodiment, a length of a portion of the insertion part that is inserted into the body part when the display panel is unfolded may be smaller than a length of a portion of the insertion part that is inserted into the body part when the display panel is folded.

In an embodiment, the support member may further include a key inside the body part, and an inserted portion of the insertion part that is located inside the body part may have a key groove defined therein and on which the key is configured to be hung.

In an embodiment, the key groove may include a plurality of key grooves located along the second direction.

In an embodiment, when the display panel is unfolded, the guide part may be configured to overlap with the extension parts sequentially from an extension part at an outermost position of the extension parts to an extension part at a central position of the extension parts.

In an embodiment, when the display panel is folded, the guide part may be configured to not overlap with the extension parts sequentially from an extension part at a central position of the extension parts to an extension part at an outermost position of the extension parts.

In an embodiment, the display apparatus may further include: a lower cover member overlapping with the folding area, and connected to the base member; and an upper cover member connected to the lower cover member to cover the support member.

In an embodiment, the support member may be connected to the lower cover member.

In an embodiment, the base member may have a plurality of grooves defined therein, the plurality of grooves configured to accommodate the support member and the hinge member.

In an embodiment, the base member may include a plurality of base members, each of the base members overlapping with a different one of the non-folding areas, and when the display panel is folded, rear surfaces of the base members may contact each other.

In an embodiment, the hinge member may include a coupling part extending in the second direction from the joint parts, the coupling part being connected to the base member.

According to one or more embodiments of the present disclosure, a display apparatus includes: a display panel including: a folding area foldable around a virtual folding axis extending in a first direction; and non-folding areas spaced from each other with the folding area interposed therebetween; a protection member including: a hinge member located below the display panel, the hinge member overlapping with the folding area, and configured to be folded around the virtual folding axis; a base member overlapping with the non-folding areas; and a support member connected to the hinge member and the base member.

The hinge member includes: extension parts extending in the first direction and arranged along a second direction crossing the first direction, the extension parts having guide grooves, each of the guide grooves being defined by removing a portion of a corresponding extension part from among the extension parts from a lower portion of the corresponding extension part facing the base member; joint parts connected to opposite ends of each of the extension parts, and rotatably connected to one another; and a guide part including a protruding part protruding in the first direction, and configured to be connected to the guide grooves.

In an embodiment, the protruding part may be configured to be accommodated in the guide grooves when the display panel is unfolded, and the protruding part may be configured to be spaced from at least one of the guide grooves when the display panel is folded.

In an embodiment, a shape of the protruding part may include one from among a polygon shape and an oval shape, and the guide grooves may have a shape corresponding to the shape of the protruding part.

In an embodiment, when the display panel is unfolded, the guide part may be configured to overlap with the extension parts sequentially from an extension part at an outermost position of the extension parts to an extension part at a central position of the extension parts.

In an embodiment, when the display panel is folded, the guide part may be configured to not overlap with the extension parts sequentially from an extension part at a central position of the extension parts to an extension part at an outermost position of the extension parts.

BRIEF DESCRIPTION OF THE FIGURES

The above and other aspects and features of the present disclosure will be more clearly understood from the following detailed description of the illustrative, non-limiting example embodiments with reference to the accompanying drawings. In the drawings.

DETAILED DESCRIPTION

Figure 1:
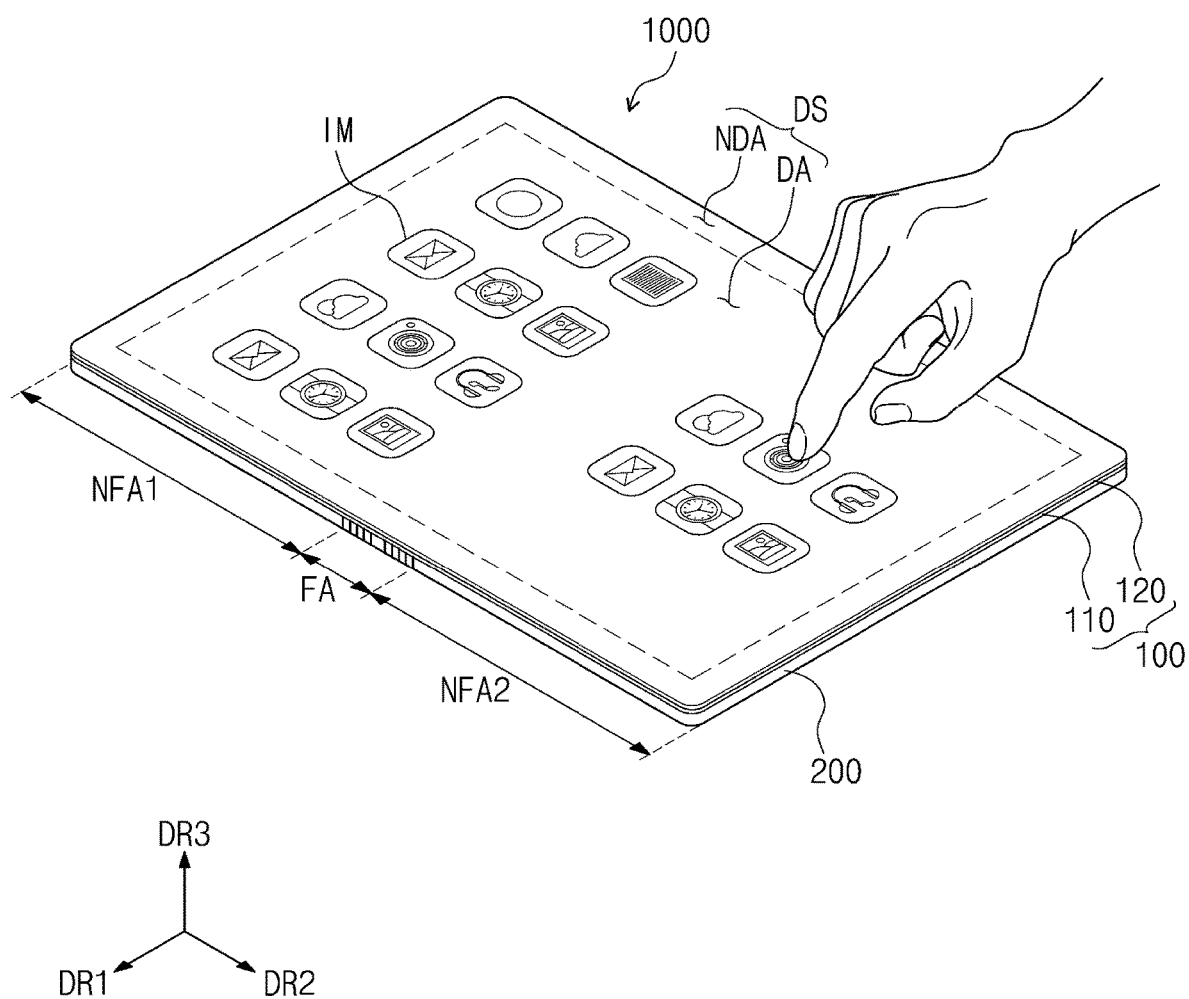
FIG. 1 is a perspective view of a display apparatus according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, dimensions, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. These terms are relative concepts and are described based on the directions indicated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the first direction DR1, the second direction DR2, and the third direction DR3 are not limited to three axes of the rectangular coordinate system, and may be interpreted in a broader sense. For example, the first direction DR1, the second direction DR2, and the third direction DR3 may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
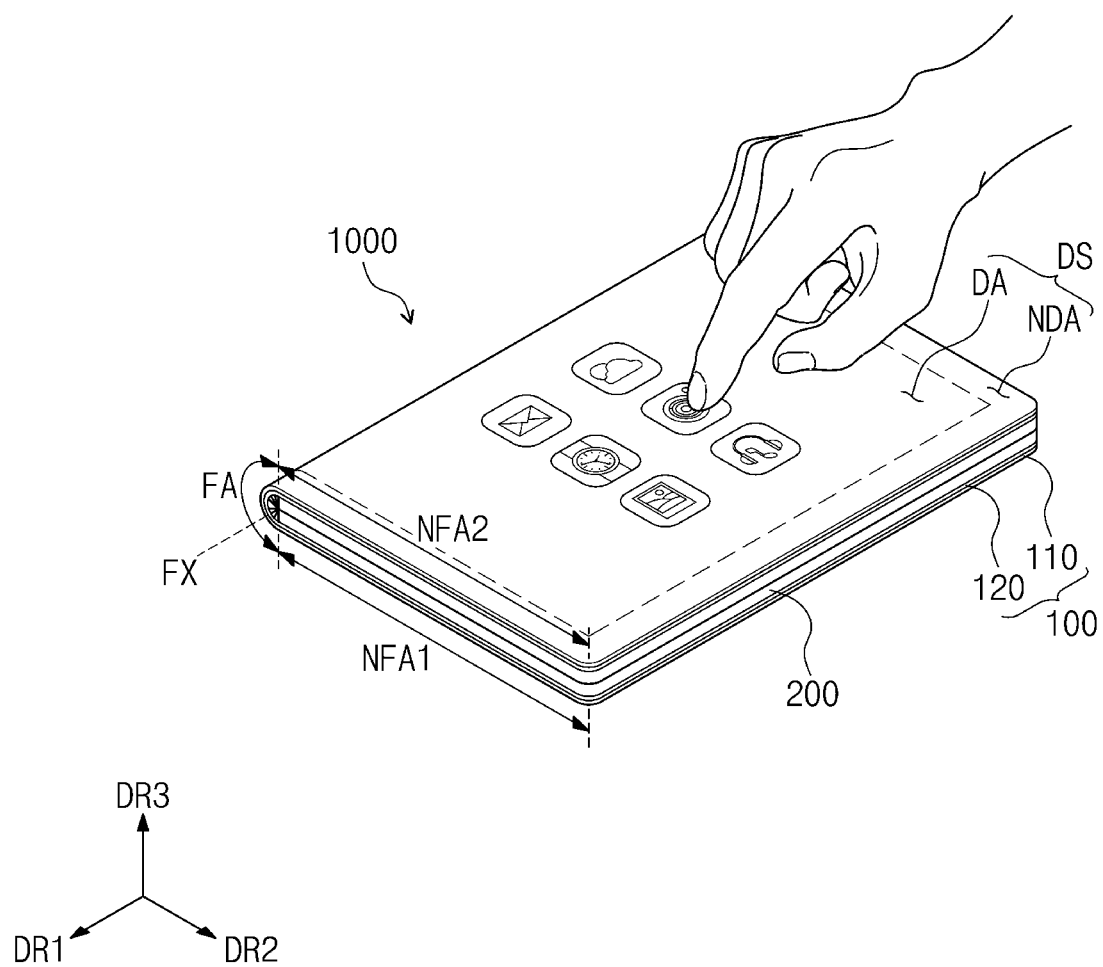
FIG. 2 is a perspective view illustrating the display apparatus in an out-folded state according to an embodiment of the present disclosure.

FIG. 1 is a perspective view of a display apparatus according to an embodiment of the present disclosure. FIG. 2 is a perspective view illustrating the display apparatus in an out-folded state according to an embodiment of the present disclosure.

Referring to FIGS. 1 and 2, the display apparatus 1000 according to an embodiment of the present disclosure may be activated according to an electrical signal. In the present embodiment, the display apparatus 1000 is illustrated as a foldable smart phone as an example. However, the present disclosure is not limited thereto, and the display apparatus 1000 may include various suitable embodiments. For example, the display apparatus 1000 may include (e.g., may be) a tablet, a notebook computer, a computer, a smart television, and/or the like.

As illustrated in FIG. 1, the display apparatus may display an image IM toward a third direction DR3 at (e.g., in or on) a display surface DS that is parallel to or substantially parallel to each of a first direction DR1 and a second direction DR2. The display surface DS at (e.g., in or on) which the image IM is displayed may correspond to a front surface of the display apparatus 1000. The image IM may include a still image and/or a moving image. In FIG. 1, applications (e.g., application icons) are illustrated as an example of the image IM.

The display surface DS includes a display region DA, and a non-display region NDA adjacent to the display region DA. The display region DA may display the image IM, and the non-display region NDA may not display an image. The non-display region NDA may surround (e.g., around a periphery of) the display region DA, and may enclose the display region DA with a suitable color (e.g., a predetermined color).

In the present embodiment, a front surface (e.g., an upper surface, a top surface, or a top) and a rear surface (e.g., a lower surface, a bottom surface, or a bottom) of each configuration, element, member, or layer are defined based on a direction (e.g., the third direction DR3) in which the image IM is displayed. The front surface and the rear surface may be opposite to each other in the third direction DR3, and the normal direction of each of the front surface and the rear surface may be parallel to or substantially parallel to the third direction DR3.

A separation distance between the front and rear surfaces in the third direction DR3 may correspond to a thickness or a height of the display apparatus 1000 (or the relevant configuration, element, member, or layer thereof) in the third direction DR3. However, the directions indicated by the first to third directions DR1, DR2, and DR3 are provided as examples, and thus, are relative concepts that may be converted to other suitable directions.

The display apparatus 1000 may sense an external input applied from the outside. The external input may include various suitable kinds of inputs that are applied from the outside of the display apparatus 1000.

For example, the external input may include a contact by a portion of a user's body, for example, such as a user's hand (e.g., a user's finger), as well as various suitable forms of external inputs (e.g. such as hovering) applied at a location close to (e.g., proximal to) or at a suitable adjacent distance (e.g., a predetermined adjacent distance) from the display apparatus 1000. In addition, the external input may include various suitable forms of inputs, for example, such as force, pressure, temperature, light, and/or the like.

The display apparatus 1000 according to an embodiment of the present disclosure may be a foldable display apparatus 1000. Accordingly, the display apparatus 1000 may be divided into a plurality of regions according to regions that are foldable. For example, the display apparatus 1000 may include a first non-folding area NFA1, a folding area FA, and a second non-folding area NFA2, which are sequentially arranged along the second direction DR2. The folding area FA may be a region that is foldable (e.g., that is folded) around a virtual folding axis FX extending in the first direction DR1 as illustrated in FIG. 2.

The folded state of the display apparatus 1000 according to an embodiment of the present disclosure may include (e.g., may be) an out-folded state in which a portion of the rear surface of a protection member 200 overlapping with the first non-folding area NFA1 and a portion of the rear surface of the protection member 200 overlapping with the second non-folding area NFA2 face each other.

However, the folded state of the display apparatus 1000 is not limited thereto, and may include (e.g., may be converted into) an in-folded state in which display surfaces DS of a display module (e.g., a display layer) 100 face each other, an in-folded state and an out-folded state, or a combination of an in-folded state and an out-folded state, without being limited to any particular embodiment.

The display module 100 may include a display panel 110 and a touch sensing unit (e.g., a touch sensing layer or a touch sensing panel) 120, each having flexibility. The touch sensing unit 120 may be formed on the display panel 110 through a continuous process, and may be disposed directly on the display panel 110.

The display panel 110 may generate an image to be provided to a user. The display panel 110 may include (e.g., may be) a liquid crystal display panel, an organic light-emitting display panel, an inorganic light-emitting display panel, an electrophoretic display panel, an electrowetting display panel, or any one of various suitable kinds of display panels capable of displaying an image.

The touch sensing unit 120 may sense an external input (a user's hand, or a touch pen), change the external input to an input signal (e.g., a predetermined input signal), and provide the input signal to the display panel 110. The touch sensing unit 120 may include a plurality of touch sensors configured to sense the external input. The touch sensors may sense the external input by using, for example, a capacitive method. The display panel 110 may receive the input signal from the touch sensing unit 120, and may generate an image corresponding to the input signal.

The protection member 200 may support the display module 100, and may rotate together with the display module 100 when folded around the folding axis FX. Because the protection member 200 is folded, the flexible display module 100 may maintain or substantially maintain the folded shape by the protection member 200. When the display apparatus 1000 is folded, the protection member 200 may enable the display apparatus 1000 to be out-folded, so that the display surface DS of the display module 100 is exposed to the outside.

Figure 3:
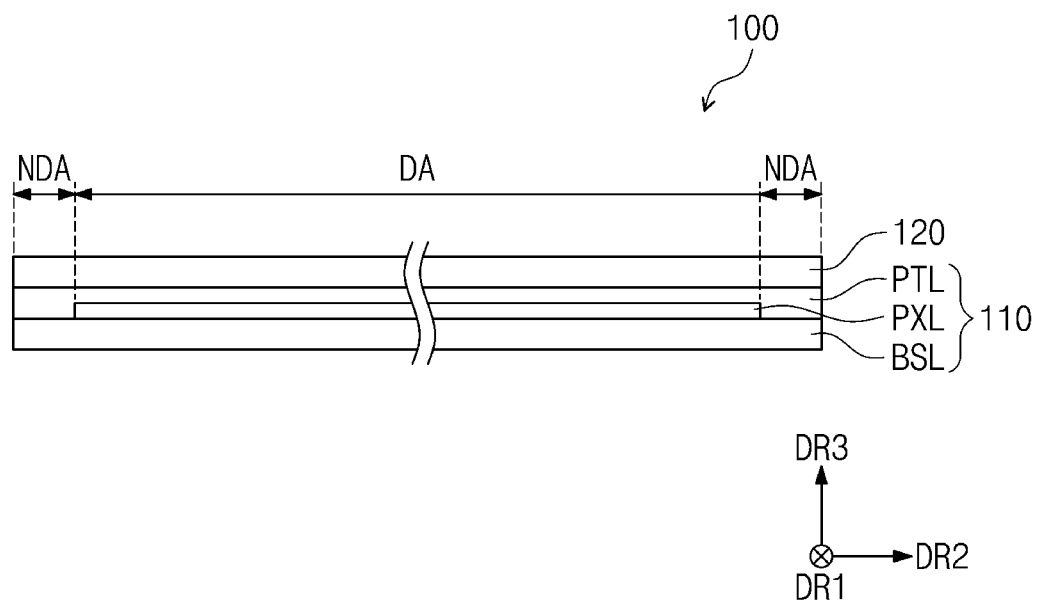
FIG. 3 is a cross-sectional view of a display module according to an embodiment of the present disclosure.

FIG. 3 is a cross-sectional view of the display module according to an embodiment of the present disclosure.

Referring to FIG. 3, the display panel 110 includes a base layer BSL, a pixel layer PXL disposed on the base layer, and a protection layer PTL covering the pixel layer PXL.

The base layer BSL may define the rear surface of the display module 100, and may have flexibility. The pixel layer PXL may include a plurality of pixels, and may be driven by receiving an electrical signal to generate an image IM. The protection layer PTL may protect the pixel layer PXL, and the touch sensing unit 120 may be disposed on the protection layer PTL. The protection layer PTL may be formed of multiple layers, and may include an organic insulating film and/or an inorganic insulating film.

Figure 4A:
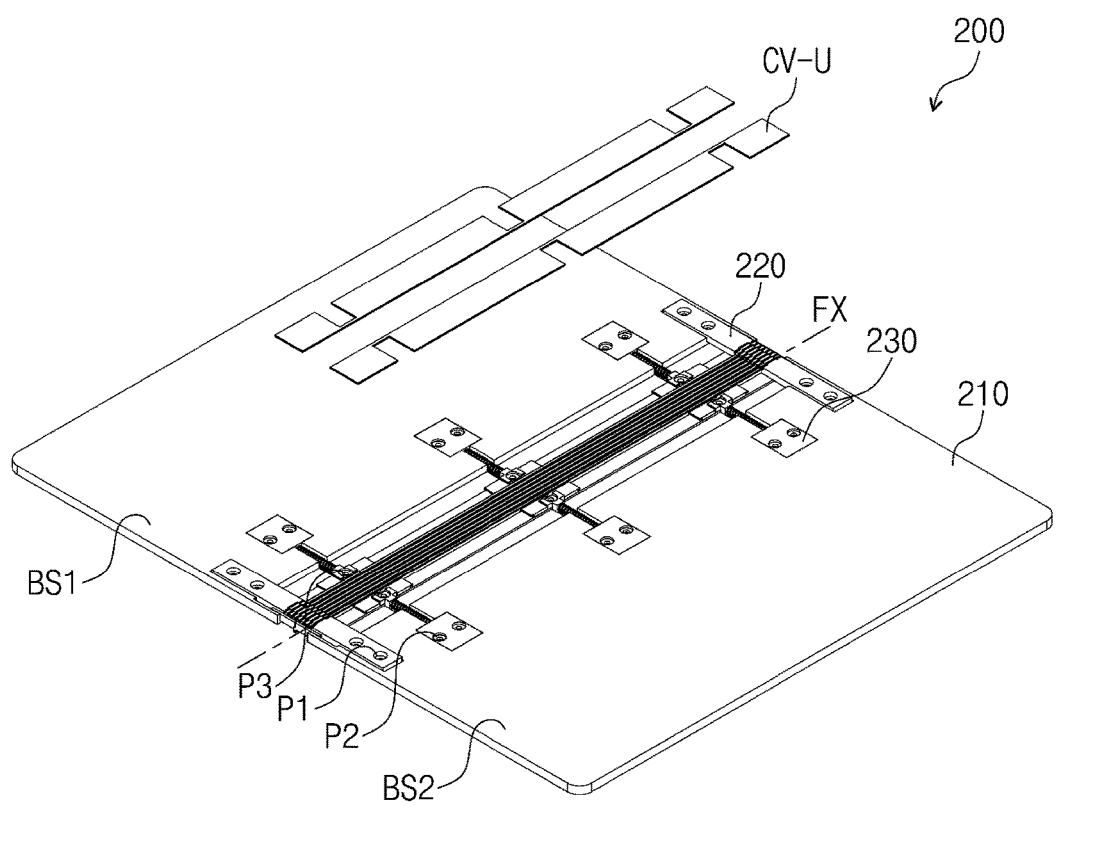
FIG. 4A is a combined perspective view of a protection member according to an embodiment of the present disclosure.
Figure 4A:
Figure 4B:
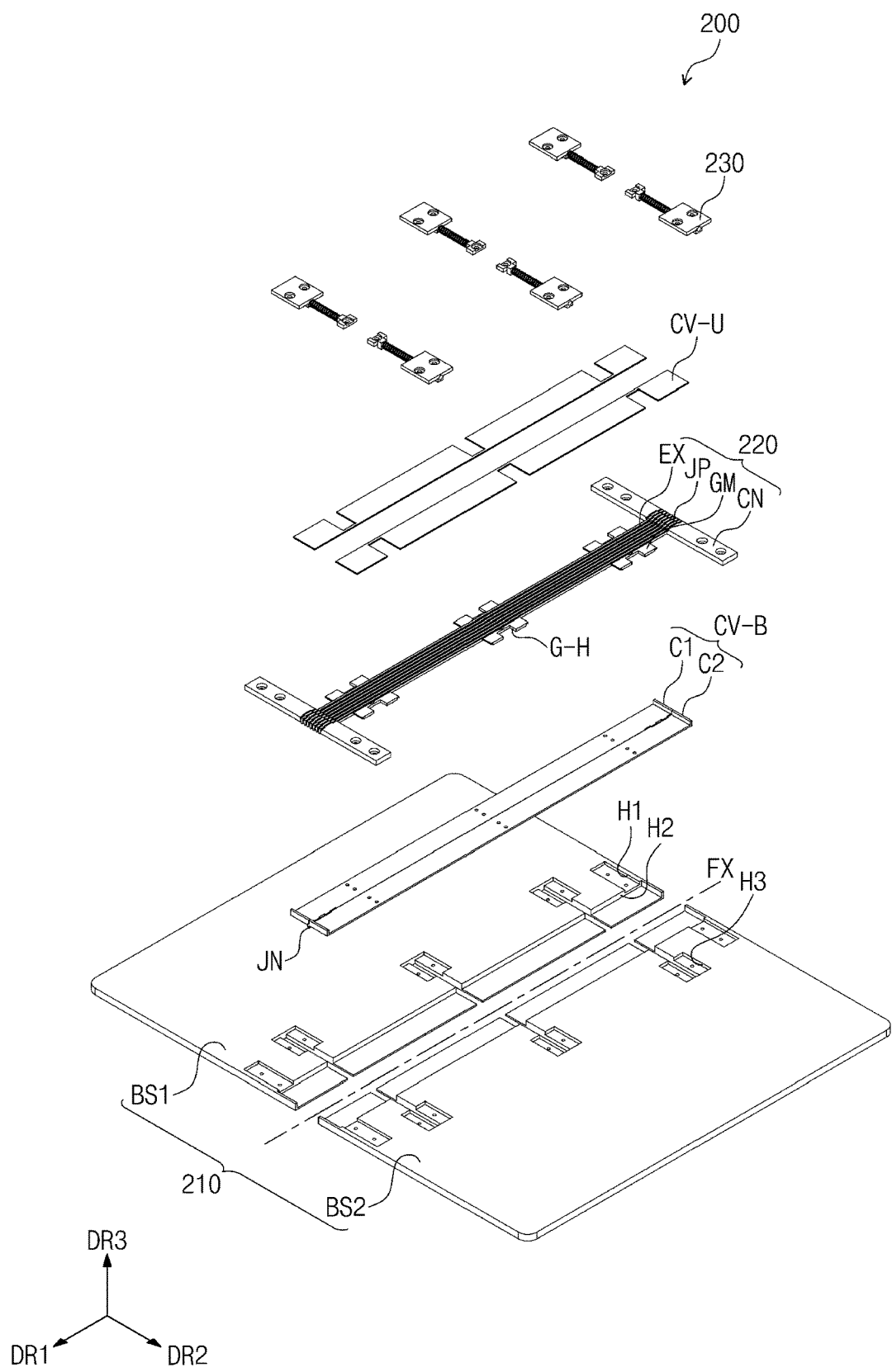
FIG. 4B is an exploded perspective view of the protection member according to an embodiment of the present disclosure.
Figure 5A:
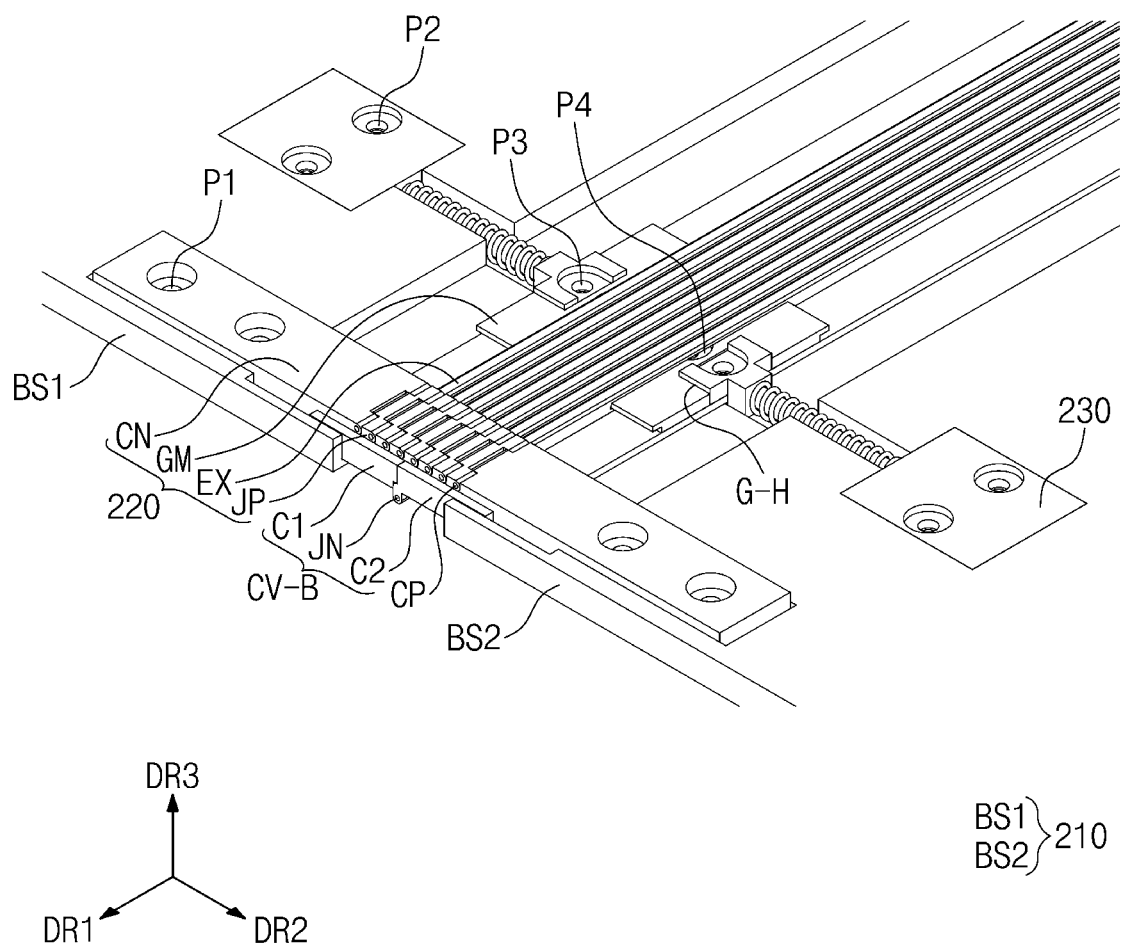
FIG. 5A is a perspective view illustrating the protection member in an unfolded state according to an embodiment of the present disclosure.
Figure 5B:
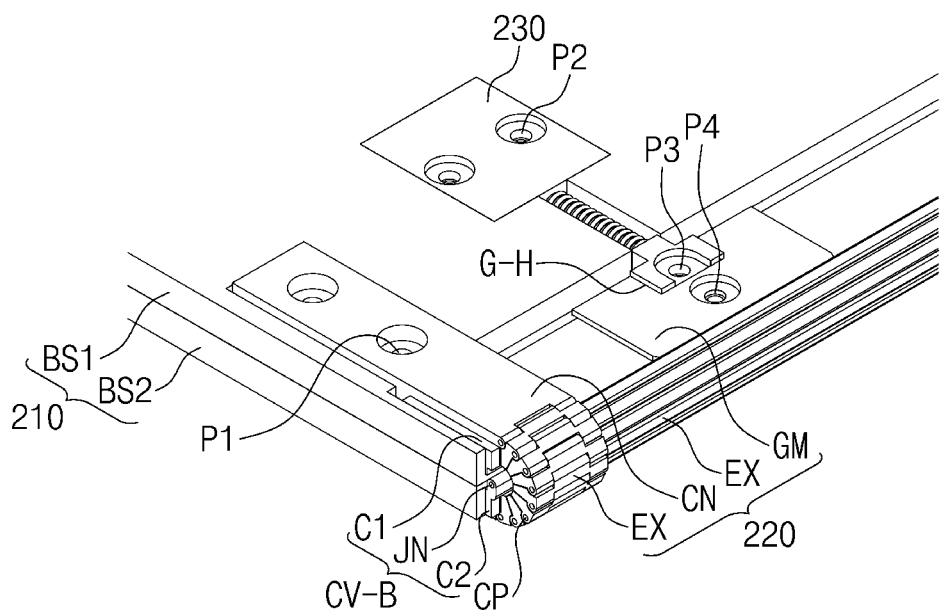
FIG. 5B is a perspective view illustrating the protection member in an out-folded state according to an embodiment of the present disclosure.
Figure 5B:
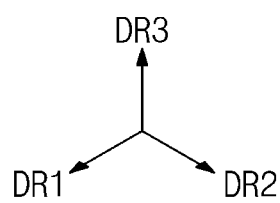
Figure 5C:
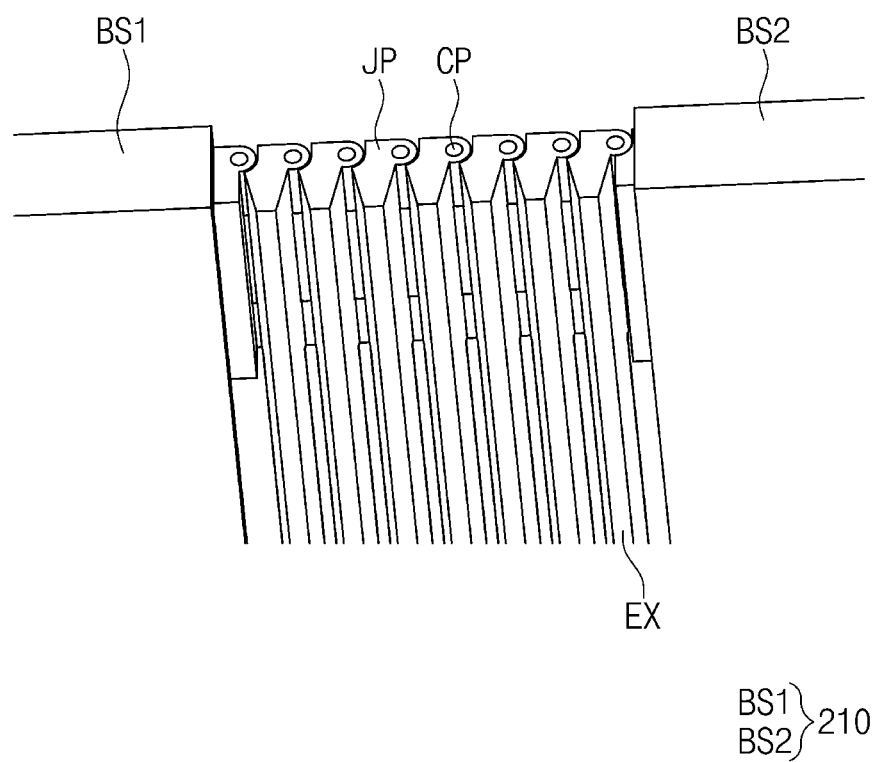
FIG. 5C is a perspective view illustrating some configurations of the protection member in an unfolded state according to an embodiment of the present disclosure.
Figure 5D:
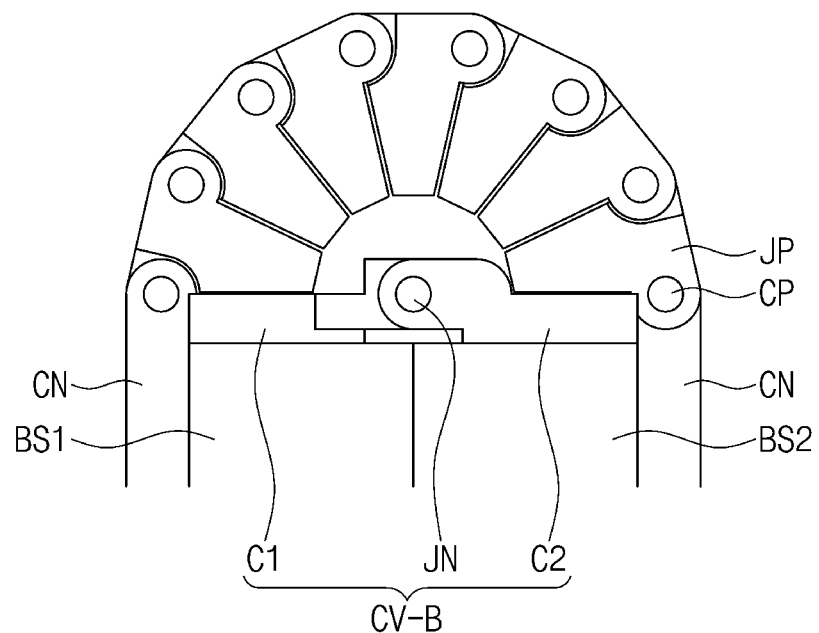
FIG. 5D is a cross-sectional view illustrating some configurations of the protection member in an out-folded state according to an embodiment of the present disclosure.

Hereinafter, the protection member 200 will be described in more detail with reference to FIGS. 4A through 5D. FIG. 4A is a combined perspective view of the protection member according to an embodiment of the present disclosure. FIG. 4A illustrates an upper cover member CV-U that is separated from the configurations included in the protection member 200. FIG. 4B is an exploded perspective view of the protection member according to an embodiment of the present disclosure. FIG. 5A is a perspective view illustrating the protection member in an unfolded state according to an embodiment of the present disclosure. FIG. 5B is a perspective view illustrating the protection member in an out-folded state according to an embodiment of the present disclosure. FIG. 5C is a perspective view illustrating some configurations of the protection member in an unfolded state according to an embodiment of the present disclosure. FIG. 5D is a cross-sectional view illustrating some configurations of the protection member in an out-folded state according to an embodiment of the present disclosure.

Referring to FIGS. 4A and 4B, the protection member 200 according to an embodiment of the present disclosure may include a base member 210, a hinge member 220, a support member 230, and cover members CV-U and CV-B.

The base member 210 may be disposed below (e.g., underneath) the display module 100, so as to support the display module 100. Between the display module 100 and the base member 210, various suitable functional layers may be disposed, for example, such as a stress relief layer configured to relieve stress applied during folding, a shock-absorbing layer configured to absorb external shocks, and a heat dissipation layer configured to absorb heat generated from the display module 100, but the present disclosure is not limited to any particular embodiment.

The base member 210 may provide a space in which configurations, members, or elements that are used when the protection member 200 is folded are disposed. For example, the base member 210 may have grooves H1, H2, and H3 defined therein. The grooves H1, H2, and H3 may be formed by removing portions of the base member 210 in the third direction DR3.

The base member 210 may be provided in a plurality. The base member 210 may include a first base member BS1 and a second base member BS2 that are arranged along the second direction DR2, and the first base member BS1 and the second base member BS2 may be disposed to be spaced apart from each other by a suitable separation space or distance (e.g., a predetermined separation space or distance). The separation space may be a space configured (e.g., may be a distance suitable) to avoid interference with extension parts EX of the hinge member 220. In an embodiment, the first base member BS1 may overlap with the first non-folding area NFA1, and the second base member BS2 may overlap with the second non-folding area NFA2.

The base members BS1 and BS2 may be disposed to be spaced apart from each other at (e.g., in or on) a portion overlapping with the folding area FA, so as to avoid interference when the display apparatus 1000 is folded.

A coupling part CN of the hinge member 220 may be disposed in a first groove H1 of the base member 210. A lower cover member CV-B may be disposed in a second groove H2 of the base member 210. The support member 230 may be disposed in a third groove H3 of the base member 210.

The hinge member 220 and the base member 210 may be connected to (e.g., coupled to or attached to) each other by bolting (e.g., by a bolt or rod extending) through a first hole P1 formed in each of the coupling part CN of the hinge member 220 and the base member 210.

The support member 230 and the base member 210 may be connected to (e.g., coupled to or attached to) each other by bolting (e.g., by a bolt or rod extending) through a second hole P2 formed in each of the body part BN (e.g., see FIG. 9) of the support member 230 and the base member 210.

The support member 230 and the lower cover member CV-B may be connected to (e.g., coupled to or attached to) each other by bolting (e.g., by a bolt or rod extending) through a third hole P3 formed in each of a fixing part SN (e.g., see FIG. 9) of the support member 230 and the cover member CV-B.

In addition, a guide part GM of the hinge member 220 and the lower cover member CV-B may be connected to (e.g., coupled to or attached to) each other by bolting (e.g., by a bolt or rod extending) through a fourth hole P4 (e.g., see FIG. 5B) formed in each of the guide part GM of the hinge member 220 and the cover member CV-B. Accordingly, the configurations, elements, and members that are used when the protection member 200 is folded may be fixedly disposed in the base member 210. However, the structure or method in which each of the configurations, elements, or members is combined with one another is not limited thereto, and a fixing device may be provided to any one configuration, element, or member and a coupling groove may be provided to a corresponding configuration, element, or member, or configurations, elements, and members may be combined with each other by an adhesive, an adhesive tape, or welding, and thus, the present disclosure is not limited to any particular structure or method.

The hinge member 220 may overlap with the folding area FA, and may rotate around the folding axis FX. The hinge member 220 includes the extension parts EX, joint parts JP, the coupling part CN, and the guide part GM.

The extension parts EX and the joint parts JP of the hinge member 220 may be disposed in the separation space between the first base member BS1 and the second base member BS2. Accordingly, the shapes of the extension parts EX and the joint parts JP of the hinge member 220, which are variable or substantially variable configurations, may be transformed during folding, without interference with the base members BS1 and BS2.

The coupling part CN of the hinge member 220 may be connected to (e.g., coupled to or attached to) each of the first base member BS1 and the second base member BS2, so that the other configurations, elements, or members of the hinge member 220 and the base members BS1 and BS2 may be stably connected to (e.g., coupled to or attached to) each other.

The extension parts EX may extend in the first direction DR1, and may be arranged to be spaced apart from each other along the second direction DR2. The extension parts EX are disposed to correspond to the folding area FA, and may support a portion of the display module 100 disposed at (e.g., in or on) the folding area FA. The number of the extension parts EX arranged along the second direction DR2 may be variously modified according to a curvature of the folding area FA, and is not limited to any particular embodiment.

According to one or more embodiments of the present disclosure, even when the display apparatus 1000 is repeatedly folded, the position, the shape, and the arrangement of the extension parts EX may be maintained or substantially maintained. When the position, the shape, and the arrangement of the extension parts EX are changed, a defect in the display module 100 may occur at (e.g., in or on) the folding area FA.

Referring to FIGS. 5A to 5D, the joint parts JP are connected to one end and another end of corresponding extension parts EX one to one. The joint parts JP may be configured to rotate or substantially rotate about the hinge member 220. The joint parts JP may be arranged along the second direction DR2, and may be connected to (e.g., coupled to or attached to) one another by coupling pins CP, so that the joint parts JP may rotate.

FIG. 5C illustrates coupling relationships of the joint parts JP, the extension parts EX, and the coupling pins CP when the display apparatus 1000 is unfolded. In FIG. 5C, the lower cover member CV-B is omitted from the rear surface of the base member 210, so that the coupling relationships of the joint parts JP, the extension parts EX, and the coupling pins CP are shown. FIG. 5D illustrates the coupling relationships of the joint parts JP and the coupling pins CP when the display apparatus is folded. The joint parts JP may have a suitable shape that allows the protection member 200 to be easily out-folded. For example, the joint parts JP may have a fan shape in which, as the closer the joint parts 210 are to the base member 210 along the third direction DR3, the width thereof becomes smaller in the second direction DR2. Accordingly, although the joint parts JP are connected to each other and are folded, the base members BS1 and BS2 may be out-folded without any influence between adjacent joint parts JP.

The coupling part CN may extend in the second direction DR2 from each one of the joint parts that are disposed at opposite ends of the joint parts JP in the second direction DR2. The extension parts EX and the joint parts JP may be connected to (e.g., coupled to or attached to) the base member 210 by the coupling part CN.

The guide part GM may overlap with the folding area FA. At least a portion of the guide part GM may overlap with the extension parts EX. According to an embodiment of the present disclosure, the guide part GM may serve as a guide to assist in maintaining or substantially maintaining the position, the shape, and the arrangement of the extension parts EX when the display apparatus 1000 is folded.

In the present embodiment, the guide part GM may have a fixing groove G-H defined therein. The fixing groove G-H may accommodate the fixing part SN (e.g., see FIG. 9) of the support member 230.

FIGS. 4A and 4B illustrate that the guide part GM is provided in a plurality, in which three guide parts GM are located at (e.g., in or on) the left base member (e.g., BS1) along the first direction DR1 and faces three guide parts GM that are located at (e.g., in or on) the right base member (e.g., BS2) along the first direction DR1, but the present disclosure is not limited thereto. For example, in other embodiments, the guide parts GM may be disposed on only one base member, or may be disposed in a zigzag form, and the arrangement and/or number thereof are not limited to any particular embodiment.

The relationships between the guide parts GM and the extension parts EX will be described in more detail below with reference to FIGS. 6A and 6B.

The support member 230 may be a configuration that maintains or substantially maintains a folded shape, or variously transforms an angle between the base members BS1 and BS2 when the display apparatus 1000 is folded. The support member may be provided in a plurality, and may be disposed in the third groove H3 of the base member 210. Because one configuration of the support member 230 includes elasticity, the support member 230 may be contracted/relaxed when folded or unfolded.

FIGS. 4A and 4B illustrate that the support member 230 is provided in a plurality, in which three support members 230 are on the left base member (e.g., BS1) and three support members 230 are on the right base member (e.g., BS2), but the present disclosure is not limited thereto, and only one support member may be disposed on each of the left and right base members BS1 and BS2, or only on one base member from among the left and right base members BS1 and BS2, and thus, the present disclosure is not limited to any particular embodiment.

The support member 230 will be described in more detail below with reference to FIGS. 9 to 10B.

The lower cover member CV-B and the upper cover member CV-U may be connected to (e.g., coupled to or attached to) each other, so as to cover a portion of the hinge member 220. The lower cover member CV-B and the upper cover member CV-U may prevent or substantially prevent the extension parts EX and the joint parts JP from being visually recognized by a user when folded, and may also prevent or substantially prevent foreign substances from entering into the extension parts EX and the joint parts JP.

The lower cover member CV-B may include a first cover part C1, a second cover part C2, and a hinge part JN. Extension parts EX that are disposed on the left side based on the center of the folding area FA, joint parts JP connected thereto, a portion of the coupling part CN, and a guide part GM may be disposed on the first cover part C1.

Extension parts EX that are disposed on the right side based on the center of the folding area FA, joint parts JP connected thereto, a portion of the coupling part CN, and a guide part GM may be disposed on the second cover part C2.

The hinge part JN may connect (e.g., may couple or attach) the first cover part C1 to the second cover part C2, and may rotate so as to correspond to the joint parts JP when the joint parts JP rotate. Therefore, the extension parts EX and the joint parts JP disposed on the first cover part C1 and the second cover part C2 may easily rotate.

Two cover parts may be provided so that the upper cover member CV-U may also correspond to the lower cover member CV-B.

Figure 6A:
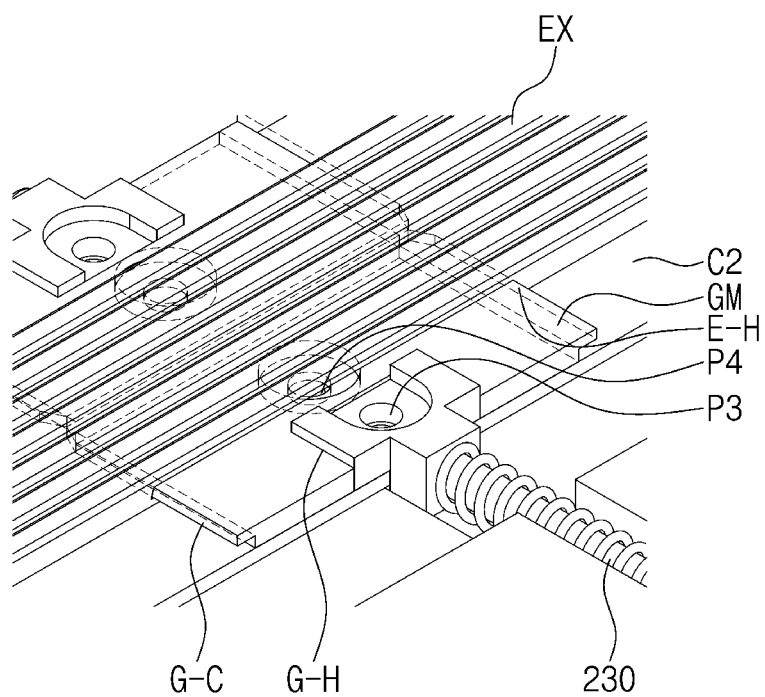
FIG. 6A is a perspective view illustrating a coupling relationship between a guide part and an extension part according to an embodiment of the present disclosure.
Figure 6B:
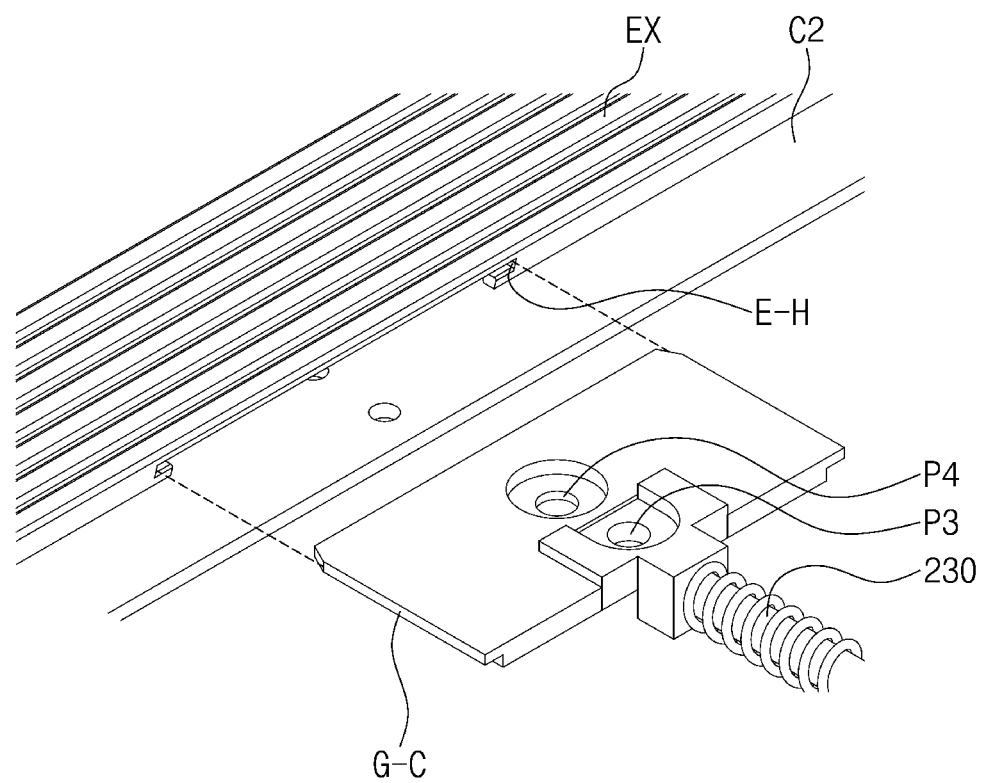
FIG. 6B is a perspective view illustrating a coupling relationship between the guide part and the extension part according to an embodiment of the present disclosure.
Figure 6C:
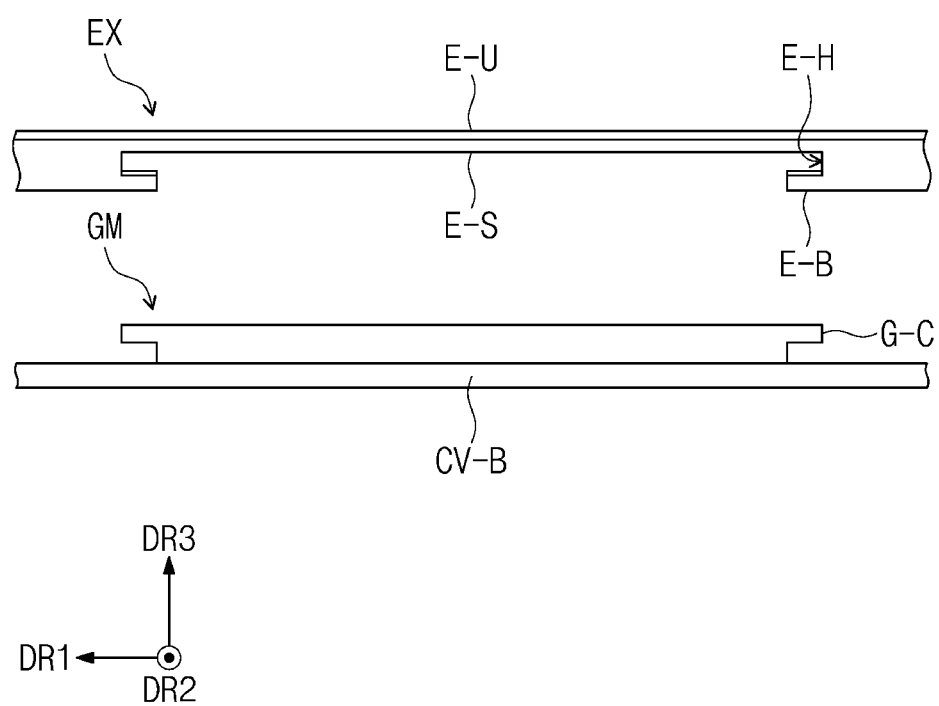
FIG. 6C is a cross-sectional view illustrating the guide part and the extension part according to an embodiment of the present disclosure.

FIGS. 6A and 6B are perspective views illustrating the coupling relationship between the guide part and the extension part according to an embodiment of the present disclosure. FIG. 6C is a cross-sectional view illustrating the guide part and the extension part according to an embodiment of the present disclosure.

FIG. 6A illustrates a state in which the extension parts EX and the guide part GM are connected to (e.g., coupled to or attached to) each other when the display apparatus 1000 is unfolded, and FIG. 6B illustrates a view in which the guide part GM is separated from the extension parts EX shown in FIG. 6A for convenience of illustration and related description.

The extension parts EX according to one or more embodiments of the present disclosure has a guide groove E-H defined therein, and the guide part GM may be inserted into and connected to (e.g., coupled to or attached to) the guide groove E-H.

Referring to FIGS. 6A to 6C, at least a portion of the extension parts EX according to one or more embodiments of the present disclosure may have the guide groove E-H defined therein. As an example, when the display apparatus 1000 is unfolded, every region of the extension parts EX overlapping with the guide part GM may have the guide groove E-H defined therein.

FIG. 6C illustrates, as an example, the guide part GM disposed on the lower cover member CV-B and the guide groove E-H defined in one extension part EX. The extension part EX may include a lower portion E-B adjacent to the lower cover member CV-B, and an upper portion E-U adjacent to the display module 100. In one or more embodiments of the present disclosure, the guide groove E-H may be defined as a space formed by removing a portion of the extension part EX.

When the guide part GM is connected to (e.g., coupled to or attached to) the guide groove E-H, the guide part GM may contact an inner surface E-S of the extension part EX. However, the present disclosure is not limited thereto, and in other embodiments, when the guide part GM is connected to (e.g., coupled to or attached to) the guide groove E-H, the inner surface E-S of the extension part EX and the guide part GM may be spaced apart from each other with a suitable space (e.g., a predetermined space) therebetween.

In the present embodiment, the upper portion of the guide part GM may have a protruding part G-C extending in the first direction DR1. In addition, the guide groove E-H may have a shape corresponding to the protruding part G-C of the guide part GM. Therefore, when the guide part GM is inserted into and connected to (e.g., coupled to or attached to) the guide groove E-H, a phenomenon in which the guide part GM is separated from the guide groove E-H in the third direction DR3 may be prevented or substantially prevented due to the protruding part G-C. For example, the protruding part G-C may have a tetragonal shape.

As illustrated in FIG. 6A, a portion of the guide part GM may be disposed within (e.g., inside) the extension parts EX when the display apparatus 1000 is unfolded. In other words, when the display apparatus 1000 is unfolded, the guide part GM may pass through and may be connected to the guide groove E-H of each of the extension parts EX. In this case, because the guide groove E-H has a shape corresponding to the protruding part G-C, the protruding part G-C may be stably connected to (e.g., coupled to or attached to) the guide groove E-H of each of the extension parts EX.

Referring again to FIG. 5A, when the display apparatus 1000 is unfolded, a portion of the guide part GM is disposed inside the guide groove E-H of each of the extension parts EX, and referring to FIG. 5B, when the display apparatus 1000 is folded, the portion of the guide part GM may be exposed and/or may be spaced apart from the extension parts EX.

Accordingly, when the display apparatus 1000 is unfolded, the guide part GM may overlap with the extension parts EX sequentially from an extension part EX disposed at the outermost position of the extension parts EX to an extension part EX disposed at the central position thereof. When the display apparatus 1000 is folded, the guide part GM may not overlap with the extension parts EX sequentially from an extension part EX disposed at the central position of the extension parts to an extension part EX disposed at the outermost position thereof.

According to one or more embodiments of the present disclosure, even when the display apparatus 1000 is repeatedly folded, the display apparatus 1000 may have improved folding properties, because the guide part GM that is configured to prevent or substantially prevent separation of the extension parts EX may be included. Furthermore, because the guide part GM is spaced apart from the extension parts EX during folding, interference that may be caused by the guide part GM may be prevented or substantially prevented during folding.

Figure 7:
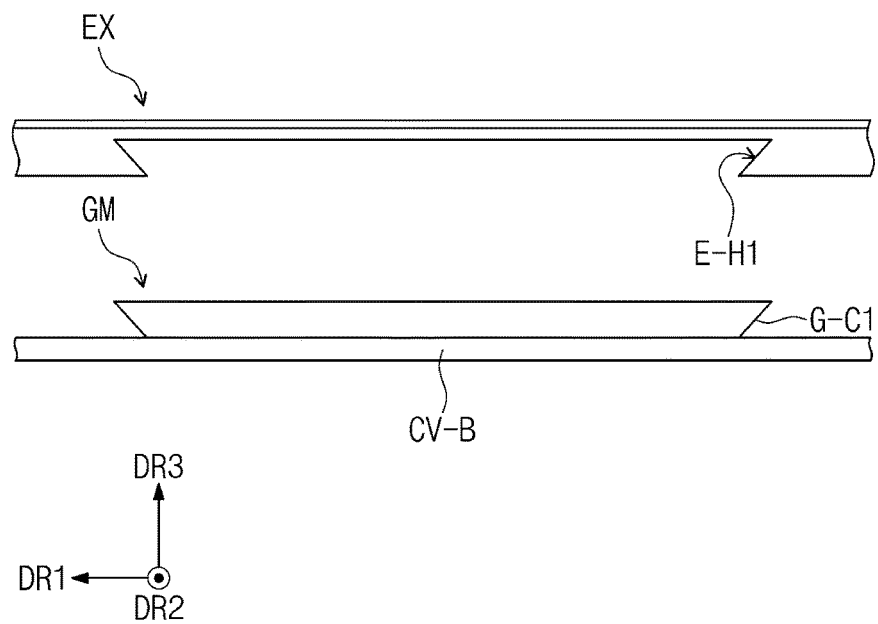
FIG. 7 is a cross-sectional view illustrating a guide part and an extension part according to an embodiment of the present disclosure.
Figure 8:
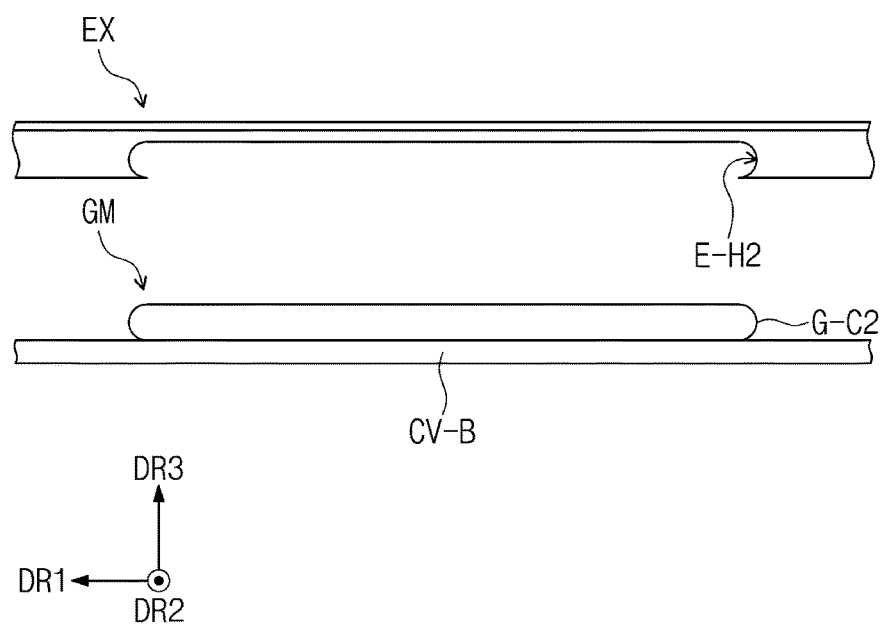
FIG. 8 is a cross-sectional view illustrating a guide part and an extension part according to an embodiment of the present disclosure.

FIG. 7 is a cross-sectional view illustrating a guide part and an extension part according to an embodiment of the present disclosure. FIG. 8 is a cross-sectional view illustrating a guide part and an extension part according to an embodiment of the present disclosure. In FIGS. 7 and 8, the same (or similar) reference symbols are used to designate the same or substantially the same (or similar) configurations, elements, and members as those illustrated in FIGS. 6A to 6C, and thus, redundant description thereof may not be repeated.

FIG. 7 illustrates a guide part GM disposed on the lower cover member CV-B and a guide groove E-H1 defined in one extension part EX.

In the present embodiment, the extension part EX may have the guide groove E-H1 defined therein. The guide groove E-H1 may be defined as a space formed by removing a portion of the extension part EX.

In the present embodiment, the upper portion of the guide part GM may include a protruding part G-C1 protruding in the first direction DR1. In addition, the guide groove E-H1 may have a shape corresponding to the protruding part G-C1 of the guide part GM. The protruding part G-C1 may have a triangular shape in a cross-sectional view as the protruding part G-C1 inclines from the lower cover member CV-B. Therefore, when the guide part GM is inserted into and connected to (e.g., coupled to or attached to) the guide groove E-H1, a phenomenon in which the guide part GM is separated from the guide groove E-H1 in the third direction DR3 may be prevented or substantially prevented due to the protruding part G-C1.

FIG. 8 illustrates, as an example, a guide part GM disposed on the lower cover member CV-B and a guide groove E-H2 defined in one extension part EX.

In the present embodiment, the extension part EX may have the guide groove E-H2 defined therein. The guide groove E-H2 may be defined as a space formed by removing a portion of the extension part EX.

In the present embodiment, the upper portion of the guide part GM may include a protruding part G-C2 protruding in the first direction DR1. In addition, the guide groove E-H2 may have a shape corresponding to the protruding part G-C2 of the guide part GM. The protruding part G-C2 may protrude from the lower cover member CV-B in an oval shape. Therefore, when the guide part GM is inserted into and connected to (e.g., coupled to or attached to) the guide groove E-H2, a phenomenon in which the guide part GM is separated from the guide groove E-H2 in the third direction DR3 may be prevented or substantially prevented due to the protruding part G-C2.

Figure 9:
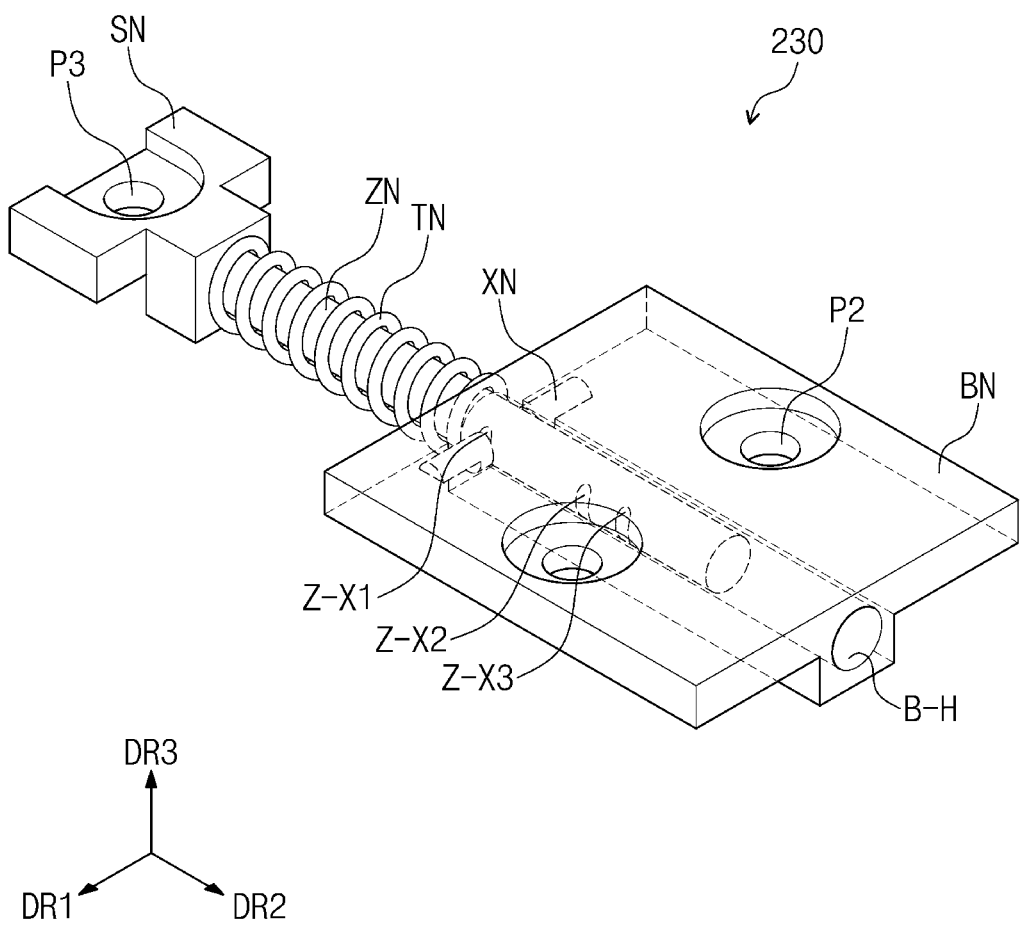
FIG. 9 is a perspective view of a support member according to an embodiment of the present disclosure.
Figure 10A:
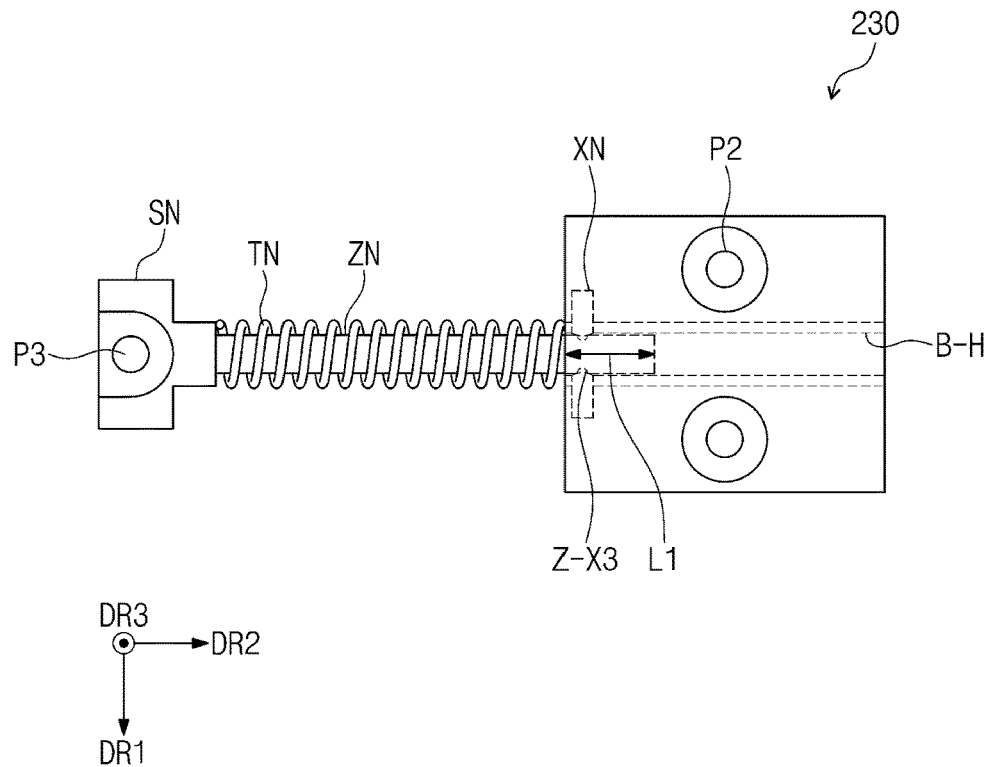
FIG. 10A is a plane view of the support member according to an embodiment of the present disclosure.

FIG. 9 is a perspective view of a support member according to an embodiment of the present disclosure. FIG. 10A is a plane view (e.g., a plan view or a view from a direction that is perpendicular to or substantially perpendicular to a top surface of the relevant configuration, element, member, or layer) of the support member according to an embodiment of the present disclosure. FIG. 10B is a plane view (e.g., a plan view or a view from a direction that is perpendicular to or substantially perpendicular to a top surface of the relevant configuration, element, member, or layer) of the support member according to an embodiment of the present disclosure.

Referring to FIG. 9, the support member 230 according to an embodiment of the present disclosure may include a fixing part SN, an insertion part ZN, a body part BN, a restoration part TN, and a key XN.

The fixing part SN may be accommodated in the fixing groove G-H (e.g., see FIG. 6A) of the guide part GM. The fixing part SN may connect (e.g., may couple or attach) the lower cover member CV-B to the support member 230 by bolting (e.g., by a bolt or a rod extending) through the third hole P3.

The insertion part ZN may have a cylindrical-column shape extending in the second direction DR2. A portion of the insertion part ZN may be inserted into the body part BN, and the rest of the insertion part ZN may be exposed from the body part BN. The portion exposed from the body part BN may be surrounded (e.g., around a periphery thereof) by the restoration part TN. One side (e.g., one end) of the insertion part ZN may be connected to (e.g., may be fixed to) one side (e.g., one end) of the fixing part SN.

The body part BN may be accommodated in the third groove H3 of the base member 210 (e.g., see FIG. 4B). The body part BN may connect (e.g., may couple or attach) the base member 210 to the support member 230 by bolting (e.g., by a bolt or a rod extending) through the second hole P2.

The body part BN according to the present embodiment may have an insertion groove B-H defined therein configured to accommodate the insertion part ZN. The insertion groove B-H may have a shape corresponding to the insertion part ZN, and may extend in the second direction DR2.

The restoration part TN may surround (e.g., around a periphery of) the insertion part ZN that is exposed from the body part BN. One end of the restoration part TN may be connected (e.g., may be fixed) to one side (e.g., one end) of the fixing part SN, and the other end of the restoration part TN may be connected (e.g., may be fixed) to one side (e.g., one end) of the body part BN facing the one side (e.g., the one end) of the fixing part SN. However, the present disclosure is not limited thereto, and the restoration part TN is not limited to any particular embodiment as long as the restoration part TN has elasticity.

According to one or more embodiments of the present disclosure, because the restoration part TN is included, a suitable tension (e.g., a predetermined tension) may be maintained or substantially maintained in a state change of the display apparatus 1000 even though the folding and unfolding states are repeated.

The support member 230 may further include the key XN. The key XN may be disposed inside the body part BN, and may control the movement of the insertion part ZN inside the body part BN. The key XN may be disposed to cross (e.g., to intersect with) the insertion part ZN.

The insertion part ZN may have key grooves defined therein Z-X1, Z-X2, and Z-X3 through which the key XN is placed. The key grooves Z-X1, Z-X2, and Z-X3 may be formed by removing a portion of the insertion part ZN. In the present embodiment, the key grooves Z-X1, Z-X2, and Z-X3 may be arranged along the second direction DR2.

A user may position the key XN in any of the key grooves Z-X1, Z-X2, and Z-X3 by applying a physical force according to convenience, and to adjust a folding angle to suit a desired purpose. Although three key grooves Z-X1, Z-X2, and Z-X3 are illustrated in the figures, the number of key grooves is not limited to any particular embodiment. In addition, an angle that may be adjusted by the user is not limited to any particular embodiment, as long as the angle allows out-folding of the display apparatus 1000.

According to one or more embodiments of the present disclosure, when the display apparatus 1000 is folded, the guide part GM is spaced apart from the extension parts EX, and when the display apparatus 1000 is unfolded, the guide part GM is disposed inside the extension parts EX. Accordingly, the length of the insertion part ZN inside the body portion BN and the degree of contraction/relaxation of the restoration part TN may be variously modified.

Figure 10B:
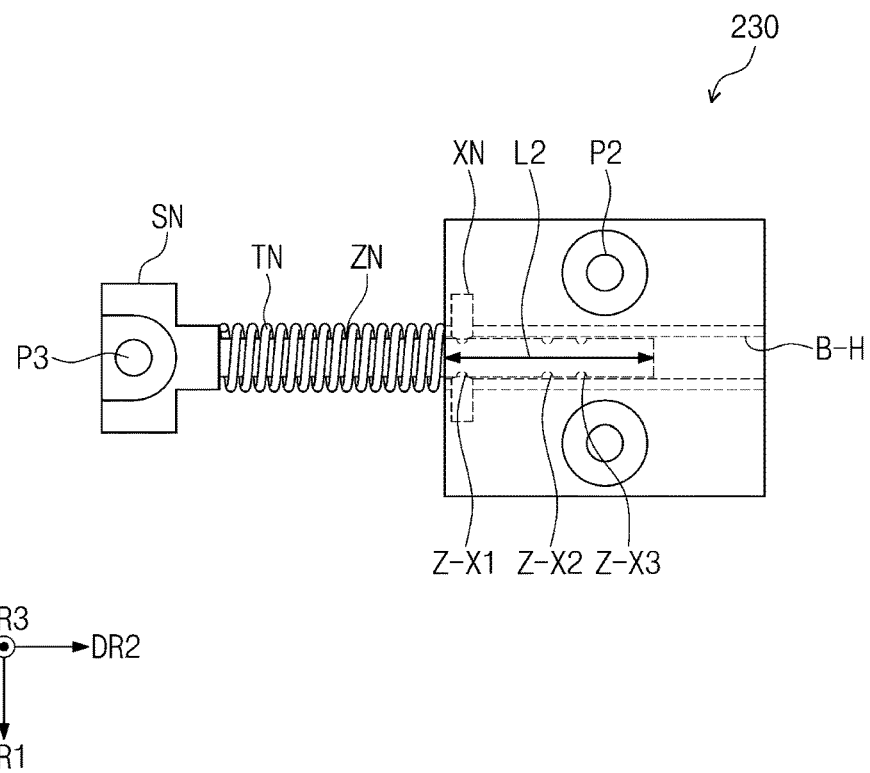
FIG. 10B is a plane view of the support member according to an embodiment of the present disclosure.

FIG. 10A displays the length of the insertion part ZN that is disposed inside the body part BN when the display apparatus 1000 is unfolded, and FIG. 10B displays the length of the insertion part ZN that is inside the body part BN when the display apparatus 1000 is folded.

When the display apparatus 1000 is unfolded (e.g., see FIG. 5A), the guide part GM according to one or more embodiments of the present disclosure is disposed inside the extension parts EX. Referring to FIG. 10A, when the display apparatus 1000 is unfolded, the insertion part ZN (e.g., a portion thereof) disposed inside the body part BN may have a first length L1.

When the display apparatus 1000 is folded (see FIG. 5B), the guide part GM according to one or more embodiments of the present disclosure may be spaced apart from the extension parts EX. In this case, referring to FIG. 5B, as the guide part GM is pushed in the second direction DR2, the insertion part ZN is inserted into the insertion groove B-H of the body part BN. Referring to FIG. 10B, when the display apparatus 1000 is folded, the insertion part ZN (e.g., a portion thereof) disposed inside the body part BN may have a second length L2. The first length L1 is smaller than the second length L2. In addition, the restoration part TN may be in a relatively more contracted state when folded than when unfolded.

According to one or more embodiments of the present disclosure, even though the display apparatus is repeatedly folded or unfolded multiple times, the occurrence of wrinkles may be prevented or substantially prevented by minimizing or reducing plastic deformation of the display panel. Accordingly, it may be possible to have a stable and high curvature, while providing a display apparatus with improved folding properties.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
   a display panel comprising:
   a folding area foldable around a virtual folding axis extending in a first direction; and
   non-folding areas spaced from each other with the folding area interposed therebetween; and
   a protection member comprising:
   a hinge member located below the display panel, the hinge member overlapping with the folding area, and configured to be folded around the virtual folding axis;
   a base member overlapping with the non-folding areas; and
   a support member coupled to the hinge member and the base member, wherein the hinge member comprises:
   extension parts extending in the first direction and located along a second direction crossing the first direction, each of the extension parts having a guide groove defined as an inner surface thereof and spaced from opposite ends thereof;
   joint parts connected to opposite ends of each of the extension parts, and rotatably coupled to one another; and
   a guide part comprising a protruding part protruding in the first direction to be inserted into the guide grooves of the extension parts, and configured to be slidably coupled to the guide grooves of the extension parts.

2. The display apparatus of claim 1, wherein the protruding part is configured to be accommodated in the guide grooves when the display panel is unfolded, and the protruding part is configured to be spaced from at least one of the guide grooves when the display panel is folded.

3. The display apparatus of claim 1, wherein:
   each of the extension parts comprises an upper portion adjacent to the display panel, and a lower portion opposite to the upper portion; and
   the guide groove of each of the extension parts is defined as the inner surface that is formed by removing a portion of a corresponding extension part from among the extension parts in a direction toward the upper portion of the corresponding extension part from the lower portion thereof.

4. The display apparatus of claim 1, wherein a shape of the protruding part includes one from among a polygon shape and an oval shape, and the guide grooves have a shape corresponding to the shape of the protruding part.

5. The display apparatus of claim 1, wherein the support member comprises:
   a fixing part partially surrounded by the guide part;
   an insertion part connected to the fixing part, and extending in the second direction;
   a body part coupled to the base member, and having an insertion groove configured to accommodate the insertion part; and
   a restoration part surrounding an exposed portion of the insertion part that is exposed from the body part, the restoration part having elasticity, and
   wherein the restoration part is configured to be in a relaxed state when the display panel is unfolded, and the restoration part is configured to be in a contracted state when the display panel is folded.

6. The display apparatus of claim 5, wherein a length of a portion of the insertion part that is inserted into the body part when the display panel is unfolded is smaller than a length of a portion of the insertion part that is inserted into the body part when the display panel is folded.

7. The display apparatus of claim 5, wherein the support member further comprises a key inside the body part, and wherein an inserted portion of the insertion part that is located inside the body part has a key groove defined therein and on which the key is configured to be hung.

8. The display apparatus of claim 7, wherein the key groove comprises a plurality of key grooves located along the second direction.

9. The display apparatus of claim 1, wherein, when the display panel is unfolded, the guide part is configured to overlap with the extension parts sequentially from an extension part at an outermost position of the extension parts to an extension part at a central position of the extension parts.

10. The display apparatus of claim 1, wherein, when the display panel is folded, the guide part is configured to not overlap with the extension parts sequentially from an extension part at a central position of the extension parts to an extension part at an outermost position of the extension parts.

11. The display apparatus of claim 1, further comprising:
a lower cover member overlapping with the folding area, and coupled to the base member; and
an upper cover member coupled to the lower cover member to cover the support member.

12. The display apparatus of claim 11, wherein the support member is coupled to the lower cover member.

13. The display apparatus of claim 1, wherein the base member has a plurality of grooves defined therein, the plurality of grooves configured to accommodate the support member and the hinge member.

14. The display apparatus of claim 1, wherein the base member comprises a plurality of base members, each of the base members overlapping with a different one of the non-folding areas, and
wherein, when the display panel is folded, rear surfaces of the base members contact each other.

15. The display apparatus of claim 1, wherein the hinge member comprises a coupling part extending in the second direction from the joint parts, the coupling part being coupled to the base member.

16. A display apparatus comprising:
a display panel comprising:
a folding area foldable around a virtual folding axis extending in a first direction; and
non-folding areas spaced from each other with the folding area interposed therebetween;
a protection member comprising:
a hinge member located below the display panel, the hinge member overlapping with the folding area, and configured to be folded around the virtual folding axis;
a base member overlapping with the non-folding areas; and
a support member coupled to the hinge member and the base member, wherein the hinge member comprises:
extension parts extending in the first direction and arranged along a second direction crossing the first direction, the extension parts having guide grooves, each of the guide grooves being defined by removing a portion of a corresponding extension part from among the extension parts from a lower portion of the corresponding extension part facing the base member;
joint parts connected to opposite ends of each of the extension parts, and rotatably coupled to one another; and
a guide part comprising a protruding part protruding in the first direction, and configured to be coupled to the guide grooves.

17. The display apparatus of claim 16, wherein the protruding part is configured to be accommodated in the guide grooves when the display panel is unfolded, and the protruding part is configured to be spaced from at least one of the guide grooves when the display panel is folded.

18. The display apparatus of claim 16, wherein a shape of the protruding part includes one from among a polygon shape and an oval shape, and the guide grooves have a shape corresponding to the shape of the protruding part.

19. The display apparatus of claim 16, wherein, when the display panel is unfolded, the guide part is configured to overlap with the extension parts sequentially from an extension part at an outermost position of the extension parts to an extension part at a central position of the extension parts.

20. The display apparatus of claim 16, wherein, when the display panel is folded, the guide part is configured to not overlap with the extension parts sequentially from an extension part at a central position of the extension parts to an extension part at an outermost position of the extension parts.

* * * * *